(12) United States Patent
Adelmann et al.

(10) Patent No.: US 12,514,126 B2
(45) Date of Patent: Dec. 30, 2025

(54) MAGNETOELECTRIC DEVICE INCLUDING DEFORMABLE PIEZOELECTRONIC AND MAGNETOSTRICTIVE ELEMENTS

(71) Applicant: IMEC VZW, Leuven (BE)

(72) Inventors: Hanns Christoph Adelmann, Wilsele (BE); Florin Ciubotaru, Heverlee (BE)

(73) Assignee: IMEC VZW, Leuven (BE)

( * ) Notice: Subject to any disclaimer, the term of this patent is extended or adjusted under 35 U.S.C. 154(b) by 845 days.

(21) Appl. No.: 17/811,547

(22) Filed: Jul. 8, 2022

(65) Prior Publication Data

US 2023/0012461 A1 Jan. 12, 2023

(30) Foreign Application Priority Data

Jul. 12, 2021 (EP) .................................. 21185112

(51) Int. Cl.
*H10N 30/87* (2023.01)
*H10N 35/00* (2023.01)
*H10N 35/85* (2023.01)

(52) U.S. Cl.
CPC ........... *H10N 30/872* (2023.02); *H10N 35/00* (2023.02); *H10N 35/85* (2023.02)

(58) Field of Classification Search
CPC ....... H10N 30/872; H10N 35/00; H10N 35/85
See application file for complete search history.

(56) References Cited

U.S. PATENT DOCUMENTS 8,373,514 B2 * 2/2013 Cook ...................... H04B 5/79
  323/305
8,482,157 B2 * 7/2013 Cook ...................... H02J 50/23
  307/104

(Continued)

FOREIGN PATENT DOCUMENTS

WO WO 2019/005146 A1 1/2019

OTHER PUBLICATIONS

Chasin et al., "Planar magnetoelectric voltage transformer based on a composite ferromagnet-piezoelectric heterostructure", Sensors and Actuators A Physical, vol. 328 (Sep. 2021) 112773, 6 pages.

(Continued)

*Primary Examiner* — Emily P Pham
(74) *Attorney, Agent, or Firm* — Knobbe, Martens, Olson & Bear, LLP

(57) ABSTRACT

A magnetoelectric ("ME") device is disclosed. In one aspect, the ME device includes a first piezoelectric substrate portion and a second piezoelectric substrate portion; a magnetostrictive body with a magnetization oriented in a first direction, the magnetostrictive body arranged on and extending between the first and second portions; a pair of input electrodes arranged on the first portion; and a pair of output electrodes arranged on the second portion. The input electrodes are configured to induce a fringing electric field extending between the input electrodes via the first portion, thereby causing a deformation of the first portion which in turn causes a deformation of the magnetostrictive body such that the magnetization thereof is re-oriented to a second direction due to a reverse magnetostriction. An output voltage is induced between the output electrodes by a deformation of the second portion caused by the re-orientation of the magnetization of the magnetostrictive body.

15 Claims, 5 Drawing Sheets

(56) References Cited

U.S. PATENT DOCUMENTS

| | | |
|---|---|---|
| 2005/0194863 A1 | 9/2005 | Viehland et al. |
| 2016/0005949 A1 | 1/2016 | Lynch et al. |
| 2017/0352802 A1 | 12/2017 | Nikonov et al. |
| 2019/0325932 A1 | 10/2019 | Manipatruni et al. |

OTHER PUBLICATIONS

Li et al., "Effect of adjustable bias voltage on magnetoelectric properties of piezoelectric/magnetorestrictive laminate transducer", 2012 IEEE International Ultrasonics Symposium Proceedings, Oct. 2012, pp. 2510-2513.

Mahmoud et al., "2-output Spin Wave Programmable Logic Gate", 2020 IEEE Computer Society Annual Symposium on VLSI (ISVLSI), Jul. 2020, 6 pages.

Mahmoud et al., "Introduction to spin wave computing", J. Appl. Phys. 128, 161101 (Oct. 2020); https://doi.org/10.1063/5.0019328.

Manipatruni et al., "Scalable energy-efficient magnetoelectric spin-orbit logic [Supplementary Information]", Nature, 2019, https://doi.org/10.1038/s41586-018-0770-2, 50 pages.

Manipatruni et al., "Scalable energy-efficient magnetoelectric spin-orbit logic [Paper]", Nature, vol. 565, Jan. 3, 2019, https://doi.org/10.1038/s41586-018-0770-2, 9 pages.

Nikonov et al., "Overview of Beyond-CMOS Devices and a Uniform Methodology for Their Benchmarking", Proceedings of the IEEE, vol. 101, No. 12, Dec. 2013, 36 pages.

Paradkar, "Magnetoelectric devices for beyond CMOS applications", Thesis submitted for the Degree of Master of Science in Nanoscience and Nanotechnology, Option Nanodevices and Nanophysics, Academic year 2019-2020, KU Leuven, Sep. 2020, 119 pages.

Radu et al., "Spintronic majority gates", 2015 IEEE International Electron Devices Meeting (IEDM), Dec. 2015, 4 pages.

Tierno et al., "Strain coupling optimization in Magnetoelectric Cells" Lecture/Poster, KU Leuven, Sep. 2017, 1 page.

Zhou et al., "Co-fired magnetoelectric transformer", Applied Physics Letters 104, 232906 (Jun. 2014) 5 pages.

\* cited by examiner

MAGNETOELECTRIC DEVICE INCLUDING DEFORMABLE PIEZOELECTRONIC AND MAGNETOSTRICTIVE ELEMENTS

CROSS-REFERENCE TO RELATED APPLICATIONS

This application claims foreign priority to European Application No. 21185112.6, filed Jul. 12, 2021, which is incorporated by reference herein in its entirety.

BACKGROUND

Technological Field

The disclosed technology relates to a magnetoelectric device.

Description of the Related Technology

Magnetoelectricity is a relatively recent field of study. Generally, magnetism has been linked to currents, whereas magnetoelectricity revolves around controlling magnets by voltages or electric fields. Such technology is promising in that conventional current control requires components such as cables for guiding the current that have a certain amount of inevitable heat loss to the surrounding components and substrates. Magnetoelectricity may thereby enable a reduction of power consumption and heat compared to using conventional current control.

Early experiments of magnetoelectric structures have been explored, for example, for controlling memory storage and switches. However, these structures are more generally proofs of concepts that have not been optimized and are not suitable for upscaling.

It would thereby be desirable to achieve a magnetoelectric device facilitating implementation at an industrial scale.

SUMMARY OF CERTAIN INVENTIVE ASPECTS

An objective of the disclosed technology is to provide a magnetoelectric device with a high efficiency in terms of power consumption and that is scalable and efficient to manufacture. Further or alternative objectives may be understood from the following.

According to an aspect of the disclosed technology, a magnetoelectric (ME) device is provided. The ME device includes a first piezoelectric substrate portion and second piezoelectric substrate portion; a magnetostrictive body with a net magnetization oriented in a first direction, the magnetostrictive body being arranged on and extending between the first and second piezoelectric substrate portions; a pair of input electrodes arranged on the first piezoelectric substrate portion and on opposite sides of the magnetostrictive body; and a pair of output electrodes arranged on the second piezoelectric substrate portion and on opposite sides of the magnetostrictive body; wherein the input electrodes are configured to induce, in response to an input voltage applied across the input electrodes, an electric field extending between the input electrodes via the first piezoelectric substrate portion, thereby causing a deformation of the first piezoelectric substrate portion which in turn causes a deformation of the magnetostrictive body such that the net magnetization thereof is re-oriented to a second direction due to reverse magnetostriction, and wherein the output electrodes are configured to measure an output voltage induced between the output electrodes by a deformation of the second piezoelectric substrate portion caused by the re-orientation of the magnetization of the magnetostrictive body.

An ME device according to this aspect facilitates an output voltage in response to an input voltage. Such an output voltage may be induced with a relatively low power consumption.

In aspects of the present disclosure, the strain induced in the first piezoelectric substrate portion by the induced electric field will propagate to the magnetostrictive body, causing a deformation of the magnetostrictive body. As a consequence of reverse magnetostriction, this deformation will result in re-orientation of the magnetization. This re-orientation will clearly propagate a signal to the second piezoelectric substrate portion that an input voltage is applied to the first piezoelectric substrate portion. Magnetostriction will cause the magnetostrictive body to deform, thereby introducing strain in the second piezoelectric substrate portion that causes a voltage differential between the output electrodes.

It is noted that the deformation of the magnetostrictive body may in itself propagate but will degrade faster than the re-orientation of the magnetization. Using the magnetostrictive effect can thereby allow for a clearer signal propagation.

This ME device may be scaled down to a nanometer scale, for example, around 10-100 nm, and can be simple and efficient to manufacture in that all components are arranged on a piezoelectric substrate portion.

By arranging the input electrodes on the first piezoelectric substrate portion and on opposite sides of the magnetostrictive body, they may be in the same plane, that is, arranged on the same side of the same substrate. The electric field causing the deformation of the first piezoelectric substrate portion may thereby be a fringing electric field that extends below the magnetostrictive body.

The ME device can act as a capacitive transformer, however the capacitance most relevant for its function is the fringing capacitance between the input electrodes and the magnetostrictive body through the first piezoelectric substrate portion. The direct capacitance between either of the input electrodes and the magnetostrictive body is usually negligible in comparison to the effect of the fringing capacitance due to the small height of the electrodes and the magnetostrictive body.

The fringing capacitance between the electrode pairs and the magnetostrictive body may be manipulated, as will be discussed in relation to different embodiments, to decrease the relative voltage loss between the input and the output sides of the device. This enables the ME device to be cascadable such that several ME devices may be serially connected without significant signal loss from the first input to the last output.

It may be thereby desirable to have a high capacitance at the input side, for example at the first piezoelectric substrate portion. This means that a relatively small voltage difference between the input electrodes will still result in a relatively high charge carrier density in the first piezoelectric substrate portion below the magnetostrictive body, thereby increasing the reverse piezoelectric effect.

Similarly, it may be desirable to have a low capacitance at the output side, for example at the second piezoelectric substrate portion. Thereby a relatively small induced strain will result in a relatively larger output voltage.

The term "piezoelectric" can refer to a material that has a mechanical response to an applied electric field and vice versa.

The term "magnetostrictive" can refer to a material that has a mechanical response to an applied magnetic field and vice versa. Another term used in an analogous manner is "piezomagnetic."

The term "reverse magnetostriction" can refer to a re-orientation of the magnetization of the magnetostrictive body in response to strain. This is the opposite of "magnetostriction" whereby a magnetostrictive body is strained and deforms in response to a magnetic field re-orienting its magnetization.

The term "fringing electric field" can refer to an electric field formed beyond the direct path between the input electrodes, such as the indirect path through the piezoelectric substrate in the case of devices according to the disclosed technology.

The term "X arranged on Y" can refer to X being formed, patterned, or otherwise placed either directly in contact with Y or with only coupling or connective layers between X and Y.

The first and second piezoelectric substrate portions may be mechanically separated, different substrates or different areas of the same substrate, as will be exemplified by different embodiments of the disclosed technology. The first and second piezoelectric substrate portions may be arranged in the same plane. For example, the first and second piezoelectric substrate portions can be arranged on the same side of the same substrate.

The first and/or second piezoelectric substrate portions may be unpatterned, thereby being relatively easy to manufacture.

The re-orientation of the magnetization of the magnetostrictive body is volatile.

According to one embodiment, the first and second directions are in-plane magnetization directions perpendicular to each other.

The term "in-plane directions" can refer to being perpendicular to the stacking direction of the ME device. In other words, "in-plane directions" are parallel with the plane of the first piezoelectric substrate portion.

By both the first and second directions being in-plane, a smaller strain may be required to re-orient the magnetization of the magnetostrictive body.

According to one embodiment, the first direction is out-of-plane with the device and perpendicular to the second direction.

The term "out-of-plane direction" can refer to being parallel with the stacking direction of the ME device. In other words, "out-of-plane directions" are perpendicular to the plane of the first piezoelectric substrate portion.

It may be simpler to scale the magnetostrictive body to, for example, 10 nm in length when the first direction is out-of-plane.

By the first direction being out-of-plane, a larger strain may be required to re-orient the magnetization direction to in-plane because the out-of-plane anisotropy is typically very strong. Thereby a stronger piezoelectric effect for the first piezoelectric substrate portion may be beneficial.

According to these two embodiments, the directions of the magnetization of the magnetostrictive body in the stable state and active state may be chosen to achieve a balance between a device having a low power consumption and being scalable while still providing a clear and cascadable signal.

According to one embodiment, the ME device further includes a deformation coupling layer between the magnetostrictive body and the first and/or second piezoelectric substrate portions.

The deformation coupling layer may simplify manufacturing and increase the transfer of strain from the piezoelectric substrate portion(s) to the magnetostrictive body.

According to one embodiment, the first and second piezoelectric substrate portions are made of different materials, wherein the first piezoelectric substrate portion has a higher piezoelectric d-coefficient than the second piezoelectric substrate portion and the second piezoelectric substrate portion has a higher piezoelectric g-coefficient than the first piezoelectric substrate portion.

The piezoelectric d-coefficient represents induced strain per voltage and has a unit of pm/V. The piezoelectric g-coefficient, that is, the inverse piezoelectric coefficient, represents induced voltage per stress and has a unit of mV/(Pa).

A specific piezoelectric material may be more suitable for transferring strain to voltage or voltage to strain. The first piezoelectric substrate portion is primarily being used to induce a mechanical response to an electric field, and the second piezoelectric substrate portion is primarily being used to induce a voltage differential as a response to stress.

By optimizing the material choice of each piezoelectric substrate portion depending on the desired effect, the signal will propagate more effectively between the input and output, and there will be a lower difference between the input voltage and output voltage, thereby enabling a cascadable device.

According to one embodiment, the first and second piezoelectric substrate portions are part of the same piezoelectric substrate.

By being part of the same substrate, the first and second piezoelectric substrate portions are formed at the same time and in the same layer. By using a single piezoelectric substrate, manufacturing may be simplified.

According to one embodiment, the first and second piezoelectric substrate portions of the same piezoelectric substrate are separated along the plane of the substrate by a non-piezoelectric material.

Separating the first and second piezoelectric substrate portions may, for example, ensure that the input voltage does not affect the output voltage or prevent strain of the first piezoelectric substrate portion from propagating to the second piezoelectric substrate portion. The first and second piezoelectric substrate portions may be mechanically and/or electrically separated by the non-piezoelectric material.

According to one embodiment, the magnetostrictive body has an oblong shape with its longest dimension extending between the first and second piezoelectric substrate portions.

The magnetostrictive body may thereby have an elliptical shape.

The oblong shape is a material-efficient way to connect the first and second piezoelectric substrate portions.

According to one embodiment, the magnetostrictive body has a length extending between the first and second piezoelectric substrate portions of 10-100 nm.

At this scale, the magnetic domains of the magnetostrictive body will not nucleate. Thereby, the re-orientation of the magnetization of the magnetostrictive body will occur for the entire magnet, ensuring a clear and strong signal propagation.

Additionally, the deformation of the magnetostrictive body will not relax at this scale, further ensuring a clear and strong signal propagation.

It may be further beneficial for the magnetostrictive body to have a length extending between the first and second piezoelectric substrate portions of 10-50 nm.

According to one embodiment, the input electrodes are arranged closer to the magnetostrictive body than the output electrodes are.

As previously discussed, it may be desirable to manipulate the capacitance of the input and output sides of the ME device to, for example, enable the ME device to be cascadable.

Consequently, by arranging the input electrodes closer to the magnetostrictive body than the output electrodes are, the input electrodes are also closer together than the output electrodes are. The fringing capacitance between the input electrodes will thereby be higher than the fringing capacitance between the output electrodes, decreasing the voltage loss of the ME device.

According to one embodiment, the input electrodes have a larger surface facing toward the first piezoelectric substrate portion than the output electrodes have facing toward the second piezoelectric substrate portion.

This further increases the fringing capacitance between the input electrodes relative to the fringing capacitance between the output electrodes.

According to one embodiment, one of the output electrodes is farther away from the magnetostrictive body than the other output electrode.

This asymmetry of the output electrodes may increase a potential difference between the output electrodes.

According to one embodiment, the output voltage is at least 80% of the input voltage.

The output voltage may further be at least 90% or 95% of the input voltage. This may be a requirement for the ME device to be cascadable.

According to a second aspect of the disclosed technology, a circuit including at least one ME device according to the first aspect is provided. The circuit (for example, a driver circuit of a memory device) is configured to supply an input voltage to a pair of input electrodes of the at least one ME device and read an output voltage from a pair of output electrodes of the at least one ME device.

A circuit according to this aspect can implement the ME device of the first aspect in a circuit. The same general embodiments and advantages also apply to the ME devices in the circuit.

According to a third aspect of the disclosed technology, a circuit including at least two ME devices according to the first aspect is provided. The ME devices are connected in series to each other to form a series of ME devices, wherein the circuit is configured to supply an input voltage to a pair of input electrodes of the ME device first in the series and read an output voltage from a pair of output electrodes of the ME device last in the series.

The ME device is cascadable and may thereby be connected in series.

The term "connected in series" can refer to the same current flowing through each ME device in the series. The output of one ME device in the series is connected to the input of the next ME device in the series.

In other terms, input electrodes of each ME device in the series, except for the first, are supplied by the output voltage induced between the output electrodes of the ME device preceding that device in the series.

BRIEF DESCRIPTION OF THE DRAWINGS

The above, as well as additional objects, features, and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Figure 1A:
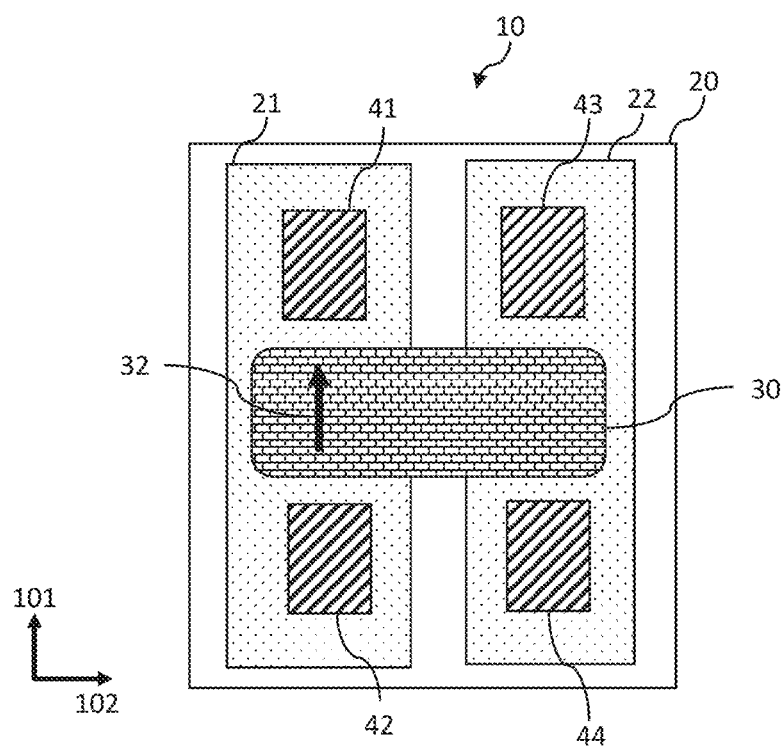
FIG. 1A is a schematic top-down view of an ME device according to an embodiment in a stable state.
Figure 1B:
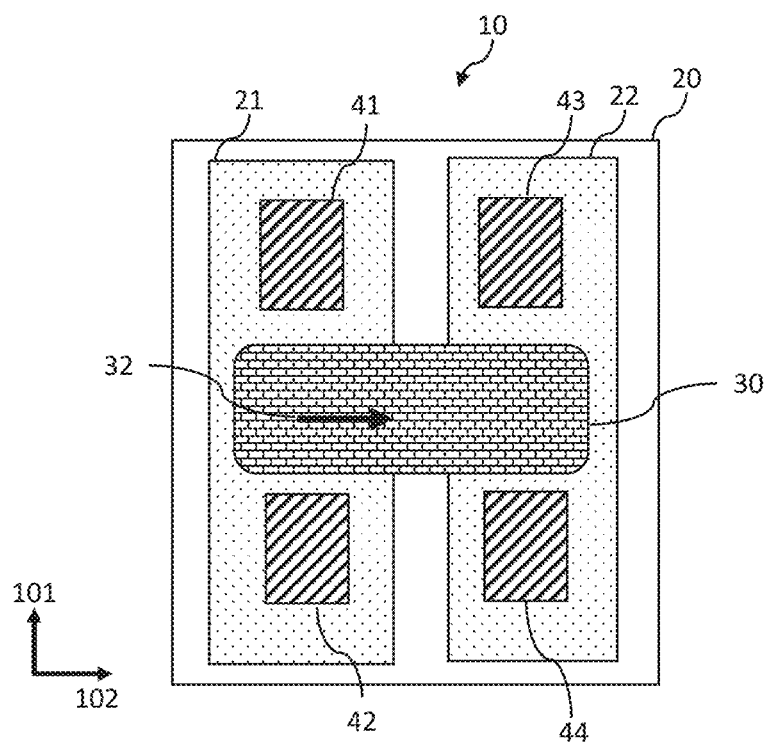
FIG. 1B is a schematic top-down view of the ME device of FIG. 1A in an active state.

FIGS. 1A and 1B illustrate an embodiment of magnetoelectric (ME) device. The ME device may, for example, form part of a logic circuit or memory device, the particulars of which are not relevant for the disclosed technology beyond the fact that different embodiments of the ME device may be particularly suitable for a specific implementation.

The difference between FIG. 1A and FIG. 1B is that FIG. 1A corresponds to a stable state of the ME device 10, and in FIG. 1B, an input voltage has been applied, resulting in a number of effects due to the material properties of the ME device 10, as will be explained further below.

The ME device includes a piezoelectric substrate 20 with a first piezoelectric substrate portion 21 and a second piezoelectric substrate portion 22. The piezoelectric substrate portions are formed by at least one piezoelectric material, for example, Ba:PbZrTiO$_x$ (PBZT), lead zirconate titanate (PZT), Pb(Mg$_{1/3}$Nb$_{2/3}$)O$_3$—PbTiO$_3$ (PMN-PT), barium titanate (BTO) and/or polyvinylidene fluoride (PVDF).

The ME device 10 further includes a magnetostrictive body 30 arranged on the piezoelectric substrate 20 and extending between the first and second piezoelectric substrate portions 21, 22.

The magnetostrictive body 30 is a material that has a mechanical response to an applied magnetic field and vice versa. Examples of such a material are Nickel, CoFeB, Galfenol (Fe$_{80}$Ga$_{20}$) and Terfenol-D (Dy$_{0.3}$Tb$_{0.7}$Fe$_2$).

The magnetostrictive body 30 is a magnet and thereby has a stable magnetization 32 in a first direction 101 as a result of aligning magnetic domains. The magnetostrictive body 30 may be ferromagnetic, ferrimagnetic or antiferromagnetic.

Figure 4A:
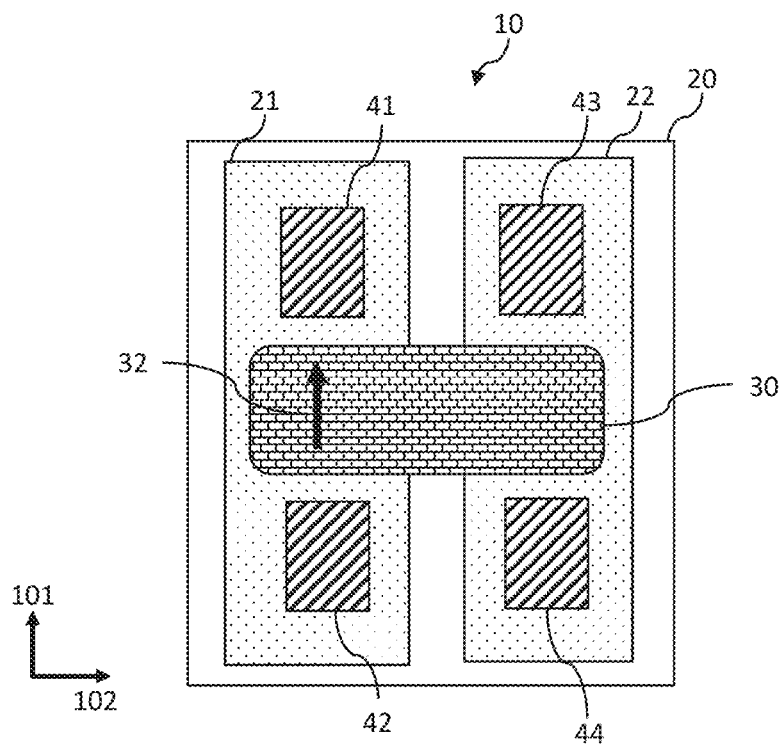
FIG. 4A is a schematic top-down view of an ME device according to an embodiment in a stable state.
Figure 4B:
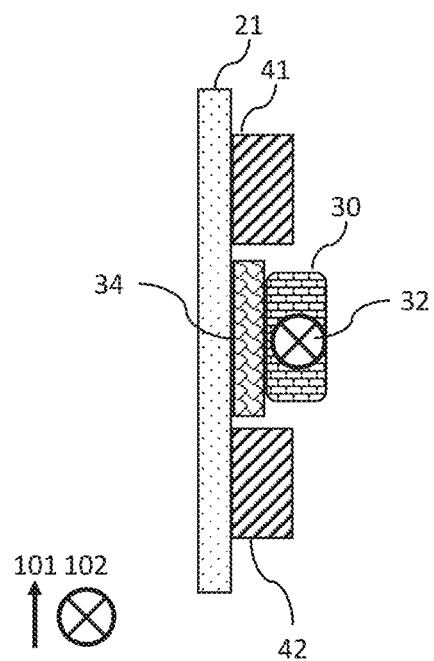
FIG. 4B is a schematic side view of the ME device of FIG. 4A in an active state.

Additionally, in all exemplary embodiments shown in FIGS. 1A and 4B, the magnetostrictive body 30 is roughly 10-100 nm long, for example, the length extending from the left edge to the right edge of the magnetostrictive body 30 in FIG. 1A. This is not large enough to enable the magnetization directions of the magnetic domains to nucleate. Any re-orientation of the magnetization 32 of the magnetostrictive body 30, for example, going from FIG. 1A to FIG. 1B, is thereby applied to the entire magnetostrictive body 30.

The first piezoelectric substrate portion 21 of the piezoelectric substrate 20 represents the input side of the ME device 10, and a pair of input electrodes 41, 42 are arranged on the first piezoelectric substrate portion 21 on opposite sides of the magnetostrictive body 30.

The second piezoelectric substrate portion 22 of the piezoelectric substrate 20 represents the output side of the ME device 10, and a pair of output electrodes 43, 44 are arranged on the second piezoelectric substrate portion 22 on opposite sides of the magnetostrictive body 30.

In the embodiment of FIGS. 1A and 1B, the first piezoelectric substrate portion 21 is defined as an area of the piezoelectric substrate 20 that is considered a part of the input side of the ME device 10. The second piezoelectric substrate portion 22 is likewise defined as an area of the piezoelectric substrate 20 that is considered a part of the output side of the ME device 10.

The first and second piezoelectric substrate portions 21, 22 thereby only differ in their relative positioning within the piezoelectric substrate 20. As will be seen, for example in relation to FIGS. 2A and 2B, the first and second piezoelectric substrate portions 21, 22 be different substrates.

The input electrodes 41, 42 are arranged on the same side of the same substrate as each other and the magnetostrictive body 30. By applying an input voltage across the input electrodes 41, 42, a fringing electric field is induced extending between the input electrodes 41, 42 via the first piezoelectric substrate portion 21 of the piezoelectric substrate 20. The input voltage may be supplied by a voltage source at a different hierarchy of the circuit including the ME device 10 and will thereby not be further discussed. In the following examples, one of the input electrodes 41 is connected to a voltage supply $V_{in}$ and the other input electrode 42 is connected to ground, though other configurations are also possible.

FIG. 1B shows the ME device 10 when an input voltage is applied. The fringing electric field induced by the input voltage will cause the first piezoelectric substrate portion 21 of the piezoelectric substrate 20 to deform due to strain caused by the piezoelectric effect.

This deformation of the first piezoelectric substrate portion 21 will cause a deformation of the magnetostrictive body 30 as a result of the magnetostrictive body 30 being arranged on the first piezoelectric substrate portion 21. In other words, the magnetostrictive body 30 and the first piezoelectric substrate portion 21 are mechanically coupled to each other such that strain in the first piezoelectric substrate portion 21 will propagate to the magnetostrictive body 30 and vice versa.

The deformation of the magnetostrictive body 30 will in turn result in a re-orientation of the magnetization 32 of the magnetostrictive body 30 from the first direction 101 to a second direction 102. This process is driven by reverse magnetostriction, that is, strain in the magnetostrictive body 30 affects its magnetic field.

The re-orientation of the magnetization 32 of the magnetostrictive body 30 will cause the magnetostrictive body 30 arranged on the second piezoelectric substrate portion 22 of the piezoelectric substrate 20 to deform due to magnetostriction. This is the reverse effect of what occurs on the input side of the ME device 10.

This deformation of the magnetostrictive body 30 will cause a deformation of the second piezoelectric substrate portion 22 as a result of the magnetostrictive body 30 being arranged on the second piezoelectric substrate portion 22. In other words, the magnetostrictive body 30 and the second piezoelectric substrate portion 22 are mechanically coupled to each other such that strain in the second piezoelectric substrate portion 22 will propagate to the magnetostrictive body 30 and vice versa.

The deformation of the second piezoelectric substrate portion 22 will in turn induce an electric field in the second piezoelectric substrate portion 22, due to its piezoelectric effect, that causes a voltage difference between the output electrodes 43, 44. Thereby an output signal is generated as a response to an input signal.

The voltage difference may, for example, be read as one of the output electrodes 43 being connected as a readout voltage source $V_{out}$ and the other output electrode 44 being connected to ground. Other configurations are also possible.

This process of piezoelectric and magnetostrictive effects interacting with each other results in strong signal propagation from the input side of the ME device 10 to the output side.

The strain in the first piezoelectric substrate portion 21 may, in theory, also propagate to the second piezoelectric substrate portion 22 either through the piezoelectric substrate 20 or the magnetostrictive body 30. However, strain propagation degrades quickly, even over short distances, so whatever strain reaches the second piezoelectric substrate portion 22 will yield an output voltage between the output electrodes 43, 44 much smaller than the input voltage. Accordingly, by using magnetostrictive propagation instead of relying only on strain propagation, the signal propagation between the input and output sides of the ME device 10 is more reliable and better suited for cascading.

In all shown examples in FIGS. 1A-4B, the re-orientation of the magnetization 32 of the magnetostrictive body 30 is volatile, for example, FIG. 1A shows a steady state of the magnetization 32 in a first direction 101, and the magnetization 32 is only in the second direction 102 as shown in FIG. 1B while the input voltage is applied.

Figure 2A:
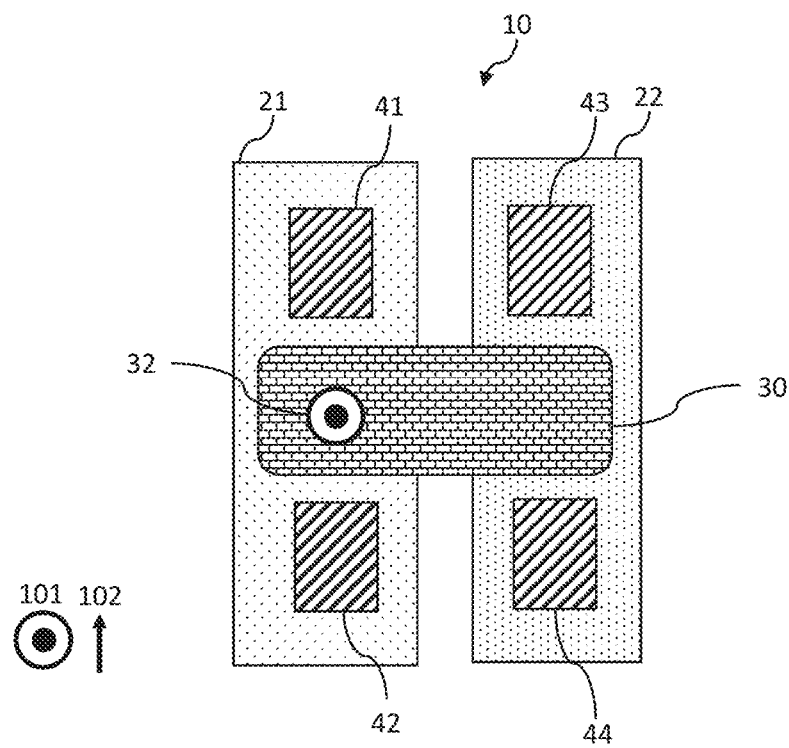
FIG. 2A is a schematic top-down view of an ME device according to an embodiment in a stable state.
Figure 2B:
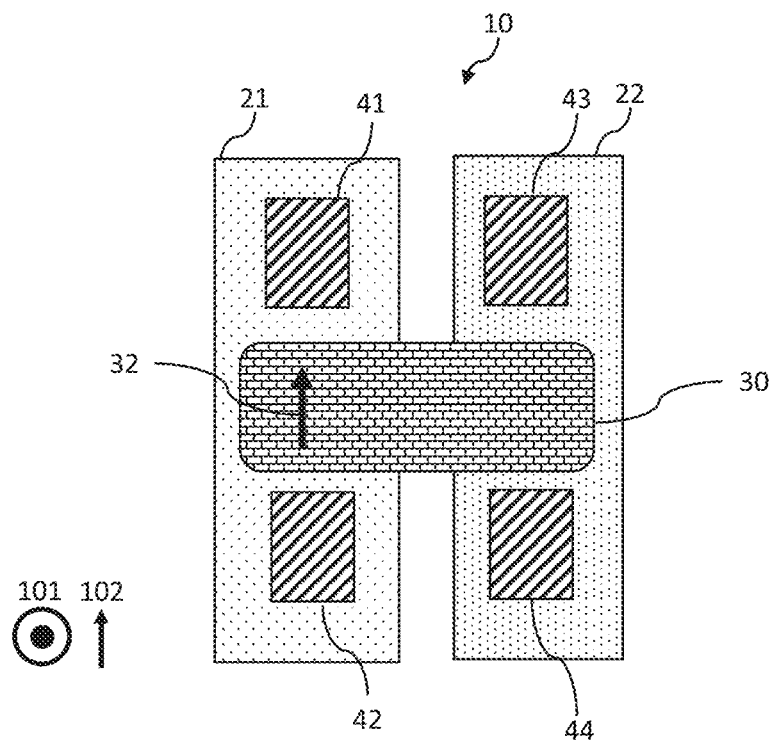
FIG. 2B is a schematic top-down view of the ME device of FIG. 2A in an active state.

The ME device 10 in FIGS. 2A and 2B differs from the one in FIGS. 1A and 1B in that the first piezoelectric substrate portion 21 and the second piezoelectric substrate portion 22 are separate from each other and are also made from different piezoelectric materials. Furthermore, independent of the first difference, the first direction 101 is an out-of-plane direction.

The first piezoelectric substrate portion 21 is made from a piezoelectric material with a high piezoelectric coefficient, such as 90-500 pm/V. Such a material is suitable for transferring voltage to strain, which is relevant for the input side of the ME device 10. Examples of such materials are PZT, PMN-PT, BTO-BFO ($BaTiO_3$—$BiFeO_3$ solid solution) and KNN (KNa-Niobate).

The second piezoelectric substrate portion 22 is made from a piezoelectric material with a high inverse piezoelectric coefficient such as 20-100 mV/(m·Pa). Such a material is suitable for transferring strain to voltage, which is relevant for the output side of the ME device 10. Examples of such materials are PVDF, $PbTiO_3$ and Sm-doped $PbTiO_3$.

It may further be beneficial for the first piezoelectric substrate portion to have a higher dielectric constant than the second piezoelectric substrate portion (for example, a dielectric constant of 1000-3000 F/m), as this results in a high polarization that maintains the dielectric and piezoelectric properties at a high frequency range (for example, at frequencies of 1-100 GHz).

The first piezoelectric substrate portion 21 and the second piezoelectric substrate portion 22 are in the same plane. The first piezoelectric substrate portion 21 and the second piezoelectric substrate portion 22 are separate from each other along this plane. The first piezoelectric substrate portion 21 and the second piezoelectric substrate portion 22 may be arranged on a same substrate, for example a semiconductor base substrate below the ME device 10.

The first direction 101 is shown as being in a stacking direction of the ME device 10, that is, perpendicular to the plane of the first piezoelectric substrate portion 21. This is considered out-of-plane with the ME device 10.

It may be easier to form the magnetostrictive body 30 with a magnetization 32 in the stable state being out-of-plane. This is because a magnetostrictive body 30 with in-plane magnetization may become superparamagnetic as it scales down in size, thereby making the direction of magnetization unstable. Anisotropy may be introduced to counteract this effect by forming the magnetostrictive body 30 with an elongated shape.

As a magnetostrictive body 30 with out-of-plane magnetization is not affected by scaling in this way, different shapes and sizes of the magnetostrictive body 30 that would otherwise be too difficult or costly to form may thereby be enabled, further increasing scalability depending on the implementation of the ME device 10.

Additionally, by the first direction 101 being out-of-plane and the second direction 102 being in-plane, a larger strain may be required to re-orient the magnetization direction to in-plane because the out-of-plane anisotropy is typically very strong. Thereby a stronger piezoelectric effect for the first piezoelectric substrate portion 21 may be beneficial in this embodiment.

Figure 3A:
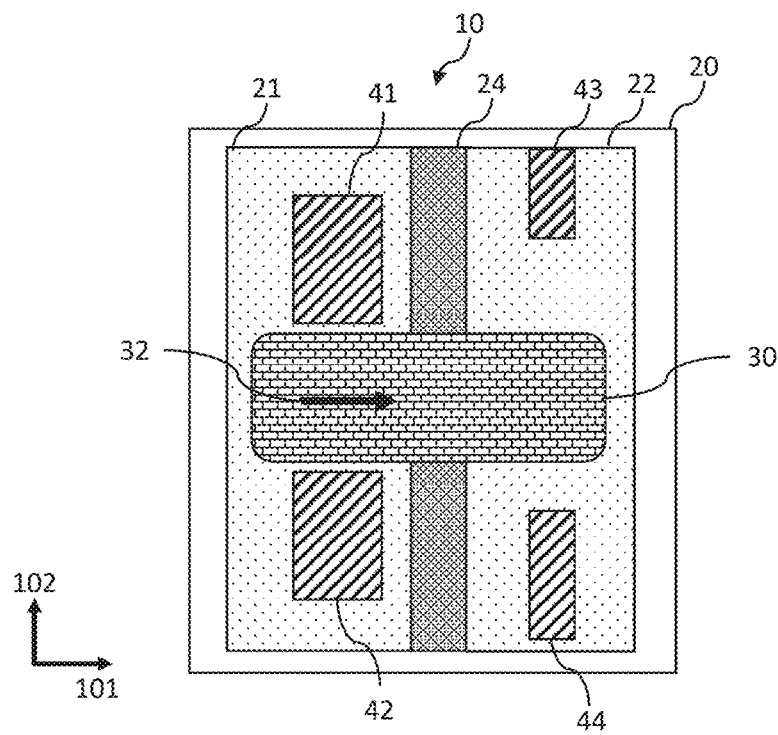
FIG. 3A is a schematic top-down view of an ME device according to an embodiment in a stable state.
Figure 3B:
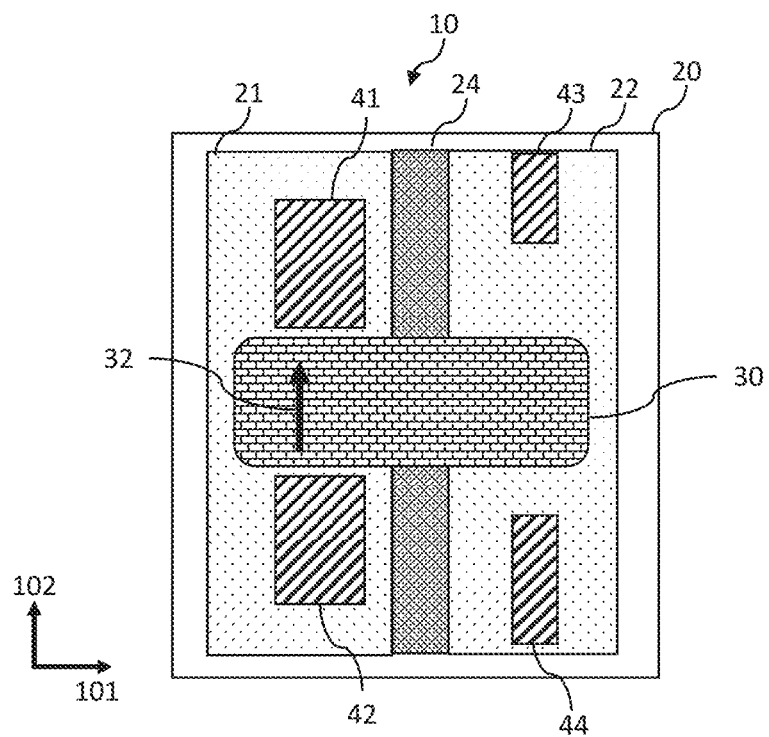
FIG. 3B is a schematic top-down view of the ME device of FIG. 3A in an active state.

The ME device 10 in FIGS. 3A and 3B differs from the one in FIGS. 1A and 1B in that the first and second piezoelectric substrate portions 21, 22 of the piezoelectric substrate 20 are separated along the plane of the piezoelectric substrate 20 by a non-piezoelectric material 24. Additionally, independent of the first difference, the placement and sizes of the input and output electrodes 41, 42, 43, 44 are different.

The piezoelectric substrate 20 in FIGS. 3A and 3B includes a first piezoelectric substrate portion 21 made from a piezoelectric material, a portion made from a non-piezoelectric material 24 and a second piezoelectric substrate portion 22 made from a piezoelectric material.

The non-piezoelectric material 24 may be mechanically and/or electrically isolating. Such a non-piezoelectric material 24 may decouple the first and second piezoelectric substrate portions 21, 22 such that strain and/or an electric field of the first piezoelectric substrate portion 21 is prevented from propagating to the second piezoelectric substrate portion 22.

The ME device 10 acts as a capacitive transformer, however the capacitance most relevant for its function is the fringing capacitance between the input electrodes 41, 42 and the magnetostrictive body 30. The direct electric field between either of the input electrodes 41, 42 and the magnetostrictive body 30 is negligible due to the small height of the electrodes 41, 42 and magnetostrictive body 30.

This capacitance may be manipulated by adapting the size and placement of the electrodes 41, 42, 43, 44 to decrease the relative voltage loss between the input and the output sides of the ME device 10. This enables the ME device 10 to be cascadable. This means that several ME devices 10 may be serially connected without significant signal loss from the first input to the last output. By a serial connection is considered connecting the output of one ME device 10 with the input of another, repeated any number of times in a series.

It may be thereby desirable to have a high capacitance at the input side, for example, the first piezoelectric substrate portion 21. This means that a relatively small voltage difference between the input electrodes 41, 42 will still result in a relatively high charge carrier density in the magnetostrictive body 30, thereby increasing the reverse magnetostrictive effect.

Similarly, it may be desirable to have a low capacitance at the output side, for example, the second piezoelectric substrate portion 22. Thereby a relatively small induced strain will result in a relatively larger output voltage.

A minimum criterium for a voltage loss over the ME device 10 that still allows for cascadability may be stated as the output voltage being at least 80% of the input voltage.

In FIGS. 3A and 3B, the input electrodes 41, 42 are arranged closer to the magnetostrictive body 30 than the output electrodes 43, 44 are. The input electrodes 41, 42 are thereby also arranged closer to each other than the output electrodes 43, 44.

The fringing capacitance between the input electrodes 41, 42 will thereby be higher than the fringing capacitance between the output electrodes 43, 44. This will result in a decreased relative voltage loss between the input and the output sides of the ME device 10.

In FIGS. 3A and 3B, the input electrodes 41, 42 have a larger surface area facing toward the first piezoelectric substrate portion 21 than the output electrodes 43, 44 have facing toward the second piezoelectric substrate portion. This may be achieved, for example, by depositing material of the input electrodes 41, 42 in a larger area than the output electrodes 43, 44.

This means that the fringing capacitance between the input electrodes 41, 42 will be higher than the fringing capacitance between the output electrodes 43, 44. This will result in a decreased relative voltage loss between the input and the output sides of the ME device 10.

In FIGS. 3A and 3B, one of the output electrodes 43 is farther away from the magnetostrictive body 30 than the other output electrode 44. The output electrodes 43, 44 are thereby asymmetrically arranged in comparison to the input electrodes 41, 42 and the magnetostrictive body 30.

This asymmetry may increase a potential difference between the output electrodes 43, 44 by being a different distance from the origin of the strain introduced in the second piezoelectric substrate portion 22.

The ME device 10 in FIGS. 4A and 4B differs from the one in FIGS. 1A and 1B in that it includes a deformation coupling layer 34 between the magnetostrictive body 30 and the first piezoelectric substrate portion 21. FIG. 4B is a side-view of the ME device 10 of FIG. 4A in an active state. The side-view is seen from the left side of FIG. 4A.

The deformation coupling layer 34 may simplify manufacturing and allow for more material choices for the magnetostrictive body 30 and the first piezoelectric substrate portion 21. Materials that would otherwise be difficult to directly connect to each other, for example due to lattice mismatch or surface tension, may thereby be used.

A deformation coupling layer 34 may alternatively or additionally be formed between the magnetostrictive body 30 and the second piezoelectric substrate portion 22.

The deformation coupling layer 34 facilitates the transfer of strain from the first and/or second piezoelectric substrate portions 21, 22 to the magnetostrictive body 30. The deformation coupling layer 34 may thereby not be too mechanically soft or malleable.

The deformation coupling layer 34 may be self-aligned with the magnetostrictive body 30 or may require aligning with the magnetostrictive body 30.

Figure 5:
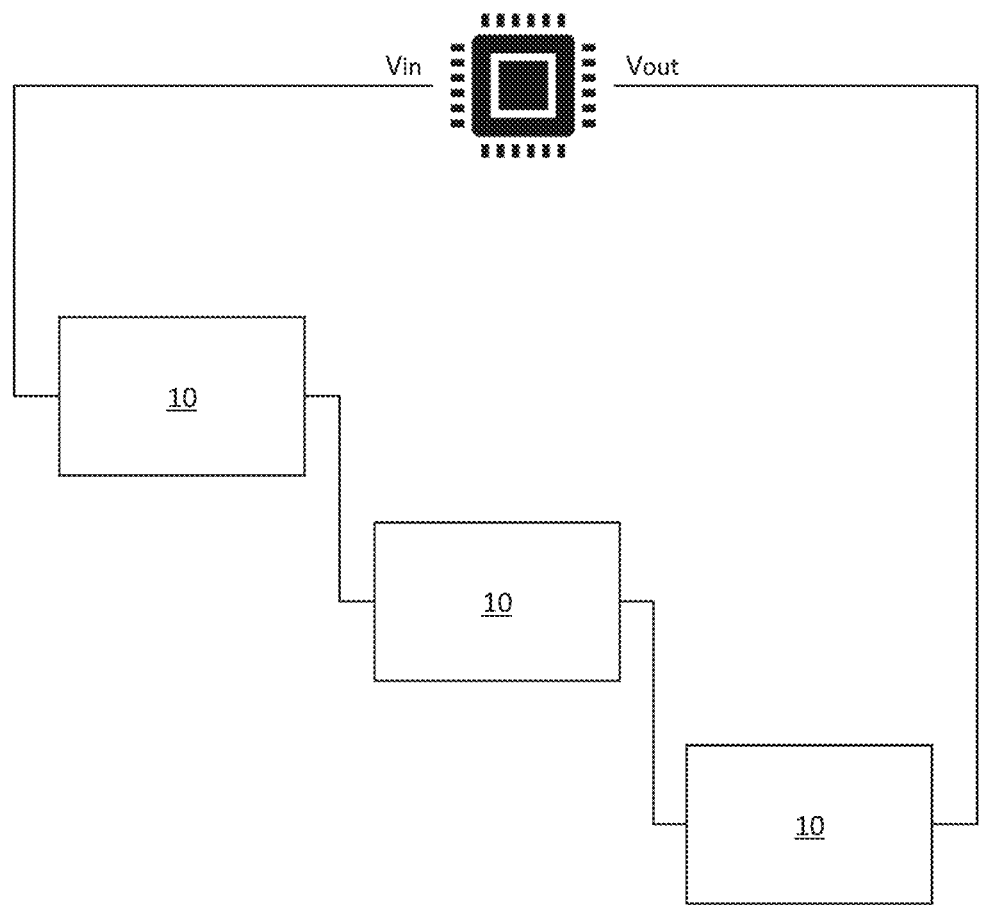
FIG. 5 is a schematic view of a circuit including ME devices according to an embodiment.

FIG. 5 shows a circuit including three ME devices 10. The three ME devices 10 are connected in series to each other, that is, the same current flows through each ME device 10. The output of the first ME device 10 in the series is connected to the input of the second ME device 10 in the series, and the output of the second ME device 10 in the series is connected to the input of the third ME device 10 in the series.

The circuit is configured to supply an input voltage $V_{in}$ to a pair of input electrodes of the ME device 10 first in the series and read an output voltage $V_{out}$ from a pair of output electrodes of the ME device 10 last in the series.

In the above, the disclosed technology has mainly been described with reference to a limited number of examples. However, as is readily appreciated by a person skilled in the art, other examples in addition to the ones disclosed above are equally possible within the scope of the disclosed technology.

What is claimed is:

1. A magnetoelectric device comprising:
   a first piezoelectric substrate portion and a second piezoelectric substrate portion;
   a magnetostrictive body with a magnetization oriented in a first direction, the magnetostrictive body being arranged on and extending between the first and second piezoelectric substrate portions;
   a pair of input electrodes arranged on the first piezoelectric substrate portion and on opposite sides of the magnetostrictive body; and
   a pair of output electrodes arranged on the second piezoelectric substrate portion and on the opposite sides of the magnetostrictive body,
   wherein the input electrodes are configured to induce, in response to an input voltage, a fringing electric field extending between the input electrodes via the first piezoelectric substrate portion, thereby causing a deformation of the first piezoelectric substrate portion which in turn causes a deformation of the magnetostrictive body such that the magnetization thereof is re-oriented to a second direction due to reverse magnetostriction, and wherein an output voltage is induced between the output electrodes by a deformation of the second piezoelectric substrate portion caused by the re-orientation of the magnetization of the magnetostrictive body.

2. The magnetoelectric device of claim 1, wherein the first and second directions are in-plane magnetization directions perpendicular to each other.

3. The magnetoelectric device of claim 1, wherein the first direction is out-of-plane with the magnetoelectric device and perpendicular to the second direction.

4. The magnetoelectric device of claim 1, further comprising a deformation coupling layer between the magnetostrictive body and the first and/or second piezoelectric substrate portions.

5. The magnetoelectric device of claim 1, wherein the first and second piezoelectric substrate portions are made of different materials, wherein the first piezoelectric substrate portion has a higher piezoelectric coefficient than the second piezoelectric substrate portion and the second piezoelectric substrate portion has a higher inverse piezoelectric coefficient than the first piezoelectric substrate portion.

6. The magnetoelectric device of claim 1, wherein the first and second piezoelectric substrate portions are part of the same piezoelectric substrate.

7. The magnetoelectric device of claim 6, wherein the first and second piezoelectric substrate portions of the piezoelectric substrate are separated by a non-piezoelectric material.

8. The magnetoelectric device of claim 1, wherein the magnetostrictive body has an oblong shape with its longest dimension extending between the first and second piezoelectric substrate portions.

9. The magnetoelectric device of claim 1, wherein the magnetostrictive body has a length extending between the first and second piezoelectric substrate portions of 10-100 nm.

10. The magnetoelectric device of claim 1, wherein the input electrodes are arranged closer to the magnetostrictive body than the output electrodes are.

11. The magnetoelectric device of claim 1, wherein the input electrodes have a larger surface facing toward the first piezoelectric substrate portion than the output electrodes have facing toward the second piezoelectric substrate portion.

12. The magnetoelectric device of claim 1, wherein an output electrode of the pair of output electrodes is farther away from the magnetostrictive body than the other output electrode of the pair of output electrodes.

13. The magnetoelectric device of claim 1, wherein the output voltage is at least 80% of the input voltage.

14. A circuit comprising the magnetoelectric device according to claim 1, wherein the circuit is configured to supply an input voltage to the pair of input electrodes of the magnetoelectric device and read an output voltage from the pair of output electrodes of the magnetoelectric device.

15. A circuit comprising at least two magnetoelectric devices according to claim 1, the at least two magnetoelectric devices connected in series to each other to form a series of magnetoelectric devices, wherein the circuit is configured to supply an input voltage to a pair of input electrodes of a magnetoelectric device that is first in the series and read an output voltage from a pair of output electrodes of a magnetoelectric device that is last in the series.

* * * * *